United States Patent
Chan et al.

(10) Patent No.: US 7,396,724 B2
(45) Date of Patent: Jul. 8, 2008

(54) DUAL-HYBRID LINER FORMATION WITHOUT EXPOSING SILICIDE LAYER TO PHOTORESIST STRIPPING CHEMICALS

(75) Inventors: Victor Chan, New Paltz, NY (US); Haining S. Yang, Wappingers Falls, NY (US); Yong M. Lee, Singapore (SG); Eng H. Lim, Singapore (SG)

(73) Assignees: International Business Machines Corporation, Armonk, NY (US); Chartered Semiconductor Manufacturing Ltd., Singapore (SG)

( * ) Notice: Subject to any disclaimer, the term of this patent is extended or adjusted under 35 U.S.C. 154(b) by 369 days.

(21) Appl. No.: 10/907,415

(22) Filed: Mar. 31, 2005

(65) Prior Publication Data

US 2006/0228848 A1 Oct. 12, 2006

(51) Int. Cl.
*H01L 21/8234* (2006.01)
(52) U.S. Cl. .............. 438/275; 438/649; 438/655; 257/E21.241; 257/E21.622
(58) Field of Classification Search ........... 438/199, 438/275, 649, 651, 655, 664, 682; 257/E20.3, 257/E21.241, E21.622
See application file for complete search history.

(56) References Cited

U.S. PATENT DOCUMENTS

| | | | |
|---|---|---|---|
| 6,717,216 | B1 | 4/2004 | Doris et al. |
| 2003/0181005 | A1* | 9/2003 | Hachimine et al. ......... 438/231 |
| 2004/0029323 | A1 | 2/2004 | Shimizu et al. |
| 2004/0079952 | A1 | 4/2004 | Yamazaki et al. |
| 2004/0113217 | A1 | 6/2004 | Chidambarrao et al. |
| 2004/0126990 | A1 | 7/2004 | Ohta |
| 2005/0118777 | A1* | 6/2005 | Bernhardt et al. .......... 438/386 |
| 2006/0079046 | A1* | 4/2006 | Yang et al. ................. 438/199 |
| 2006/0099745 | A1* | 5/2006 | Hsu et al. .................. 438/149 |
| 2006/0099765 | A1* | 5/2006 | Yang ......................... 438/301 |

* cited by examiner

*Primary Examiner*—Thanhha Pham
(74) *Attorney, Agent, or Firm*—Joseph Petrokaitis; Hoffman Warnick LLC (57) ABSTRACT

Methods of fabricating a semiconductor device including a dual-hybrid liner in which an underlying silicide layer is protected from photoresist stripping chemicals by using a hard mask as a pattern during etching, rather than using a photoresist. The hard mask prevents exposure of a silicide layer to photoresist stripping chemicals and provides very good lateral dimension control such that the two nitride liners are well aligned.

18 Claims, 9 Drawing Sheets

DUAL-HYBRID LINER FORMATION WITHOUT EXPOSING SILICIDE LAYER TO PHOTORESIST STRIPPING CHEMICALS

BACKGROUND OF THE INVENTION

1. Technical Field

The present invention relates generally to semiconductor fabrication, and more particularly, to forming a dual-hybrid liner without exposing an underlying silicide layer to photoresist stripping chemicals.

2. Related Art

The application of stresses to field effect transistors (FETs) is known to influence their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (PFET) drive currents). One way to apply such stresses to a FET is the use of intrinsically-stressed barrier silicon nitride liners. For example, a tensile-stressed silicon nitride liner may be used to cause tension in an NFET channel while a compressively-stressed silicon nitride liner may be used to cause compression in a PFET channel. However, tensile stress may degrade hole mobility and hence reduce PFET performance. Similarly, compressive stress may degrade electron mobility and hence worsen NFET performance. Accordingly, a dual/hybrid liner scheme is necessary to induce the desired stresses in an adjacent NFET and PFET.

In the formation of dual-hybrid silicon nitride liners for stress enhancement of NFET/PFET devices, the first deposited liner must be removed in one of the two FET regions by patterning and etching. One typical approach to forming a similar structure is disclosed in U.S. Patent Application Publication 2004/0029323 to Shimizu et al. In this disclosure, a silicon nitride film 13 is formed. In addition, in this disclosure, a silicon oxide film 13A (FIG. 4), e.g., P-TEOS or $O_3$-TEOS, is formed as an insulating film over the silicon nitride film 13. Silicon nitride film 13 and silicon oxide film 13A are then exposed to a photo-etching technique to remove them from over the PFET (FIG. 4(b)). Next, another silicon nitride film 14 (FIG. 4(c)) is deposited as an insulating film, and then layer 14 is exposed to a photo-etching technique to remove it from over the NFET.

Figure 4:
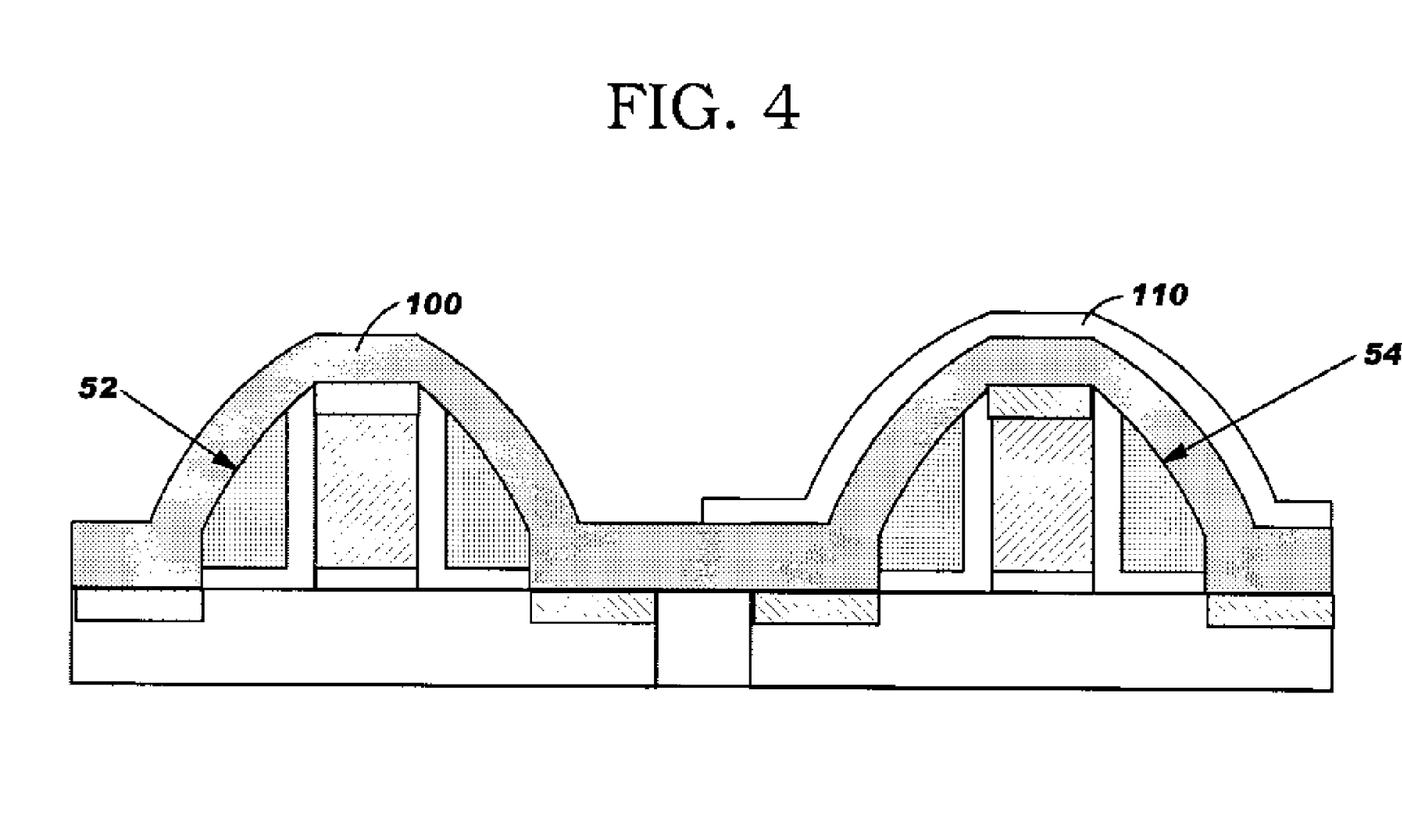

One shortcoming of the Shimizu et al. approach is that it requires exposure of an underlying silicide layer 12 adjacent the PFET to photoresist stripping chemicals in order to completely remove film 13 from the PFET region (FIG. 4(b)). Unfortunately, photoresist stripping chemicals typically include oxygen or ozone that can cause oxidation of silicide layer 12 and increased resistance. For example, a typical silicide layer normally has a resistance $R_S$ between about 6 ohm/sq and about 20 ohm/sq. By comparison, a slightly oxidized silicide layer may have a corresponding resistance $R_S$ between about 12 ohm/sq and about 40 ohm/sq. A much higher resistance or even open fail can occur when oxidation sensitive silicide is exposed. In technologies beyond 90 nm, which utilize ultra small gatelengths (e.g., <35 nm) and diffusion widths (e.g., <100 nm), such an increase in $R_s$ is unacceptable because it will impact performance of the device. In addition to the above problem, exposure of silicide layer 12 to the photoresist stripping chemicals may result in an open circuit in silicide layer 12.

In view of the foregoing, a need exists for methods of fabricating a semiconductor device having a dual-hybrid liner in which the silicide layer is protected from photoresist stripping chemicals.

SUMMARY OF THE INVENTION

The invention includes methods of fabricating a semiconductor device including a dual-hybrid liner in which an underlying silicide layer is protected from photoresist stripping chemicals by using a hard mask as a pattern during etching, rather than using a photoresist. The hard mask prevents exposure of a silicide layer to photoresist stripping chemicals and provides very good lateral dimension control such that the two nitride liners are well aligned.

A first aspect of the invention is directed to a method of fabricating a semiconductor device including a dual-hybrid liner over a PFET and an NFET, the method comprising the steps of: depositing a tensile silicon nitride layer over the PFET and the NFET; depositing a hard mask over the tensile silicon nitride layer, the hard mask including one of tetraethyl orthosilicate (TEOS), plasma-enhanced chemical vapor deposited (PECVD) silicon dioxide, carbon doped silicon dioxide and silicon carbide (SiC); removing the hard mask over the PFET to the tensile silicon nitride layer using a first photoresist mask; removing the first photoresist mask; etching to remove the tensile silicon nitride layer over the PFET using the hard mask as a pattern; depositing a compressive silicon nitride layer over the PFET and the NFET; removing the compressive silicon nitride layer over the NFET using a second photoresist mask; removing the second photoresist mask; and depositing an interlayer dielectric over the PFET and the NFET.

A second aspect of the invention includes a method of inducing stress in a transistor channel of a PFET and an NFET, the method comprising the steps of: depositing a first silicon nitride layer over the PFET and the NFET; depositing a hard mask over the first silicon nitride layer; removing the hard mask over the PFET to the first silicon nitride layer; etching the first silicon nitride layer over the PFET to a silicide layer adjacent the PFET using the hard mask over the NFET as a pattern; and forming a second silicon nitride layer over the PFET.

A third aspect of the invention related to a method of preventing exposure of a silicide layer adjacent a transistor during formation of a dual-hybrid liner to photoresist stripping chemicals, the method comprising the steps of: depositing a first silicon nitride layer over a first FET and a second FET; forming a hard mask over the first silicon nitride layer over the first FET; using the hard mask as a pattern to etch the first silicon nitride layer over the second FET; and forming a second silicon nitride layer over the second FET.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 1:
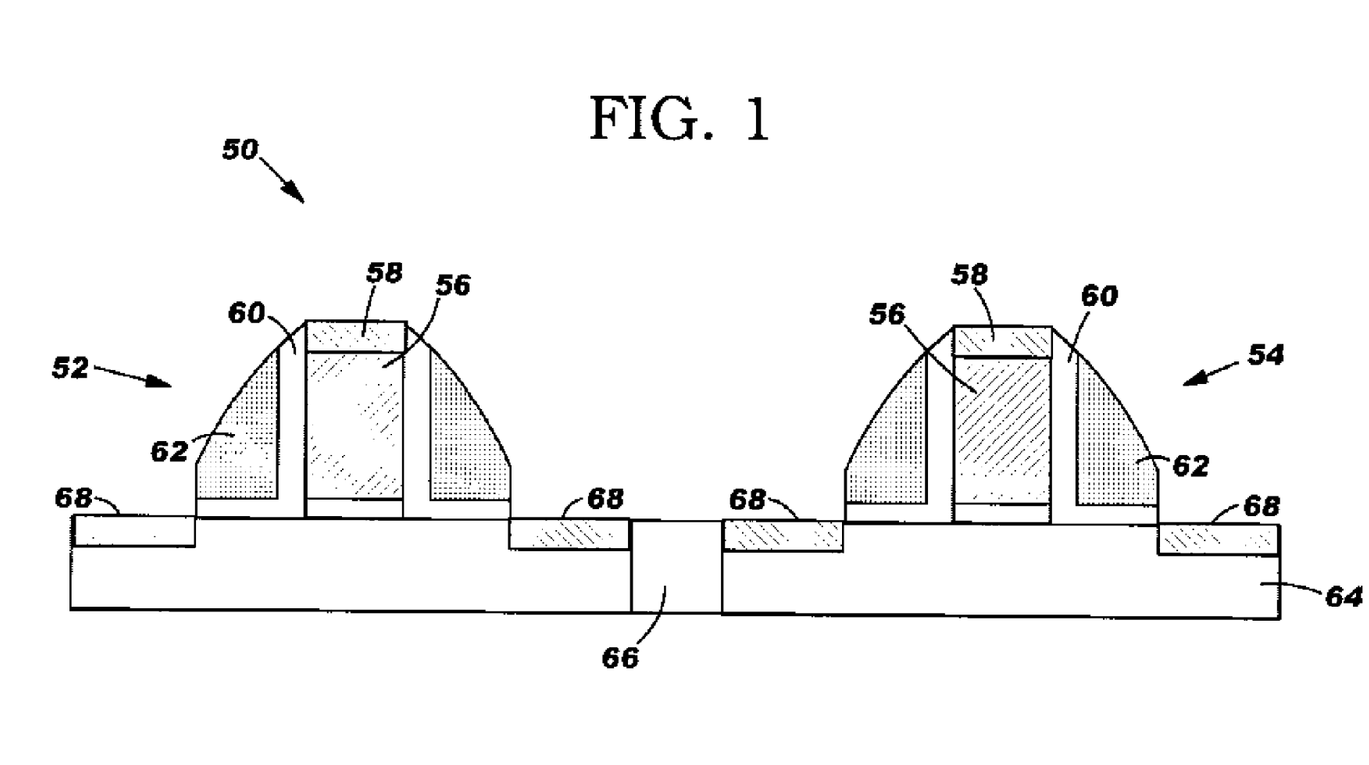
FIGS. 1-9 show an embodiment of a method of forming a semiconductor device according to the invention.

With reference to the accompanying drawings, FIG. 1 shows an initial structure 50 for a method of fabricating a semiconductor device including a dual-hybrid liner. Initial structure 50 includes a p-type field effect transistor (PFET) 52 and an n-type field effect transistor (NFET) 54. PFET 52 and NFET 54 each include a gate body 56 having a silicide cap 58, a silicon dioxide (SiO$_2$) spacer 60 and a silicon nitride (Si$_3$N$_4$) spacer 62 formed over a substrate 64. A shallow trench isolation (STI) 66 separates the FETs 52, 54. An underlying silicide layer 68 is provided in an upper region of substrate 64. It should be recognized that the teachings of the invention are not limited to this initial structure. For example, while substrate 64 is illustrated as bulk silicon, it could also be provided in a silicon-on-insulator (SOI) form.

Figure 2:
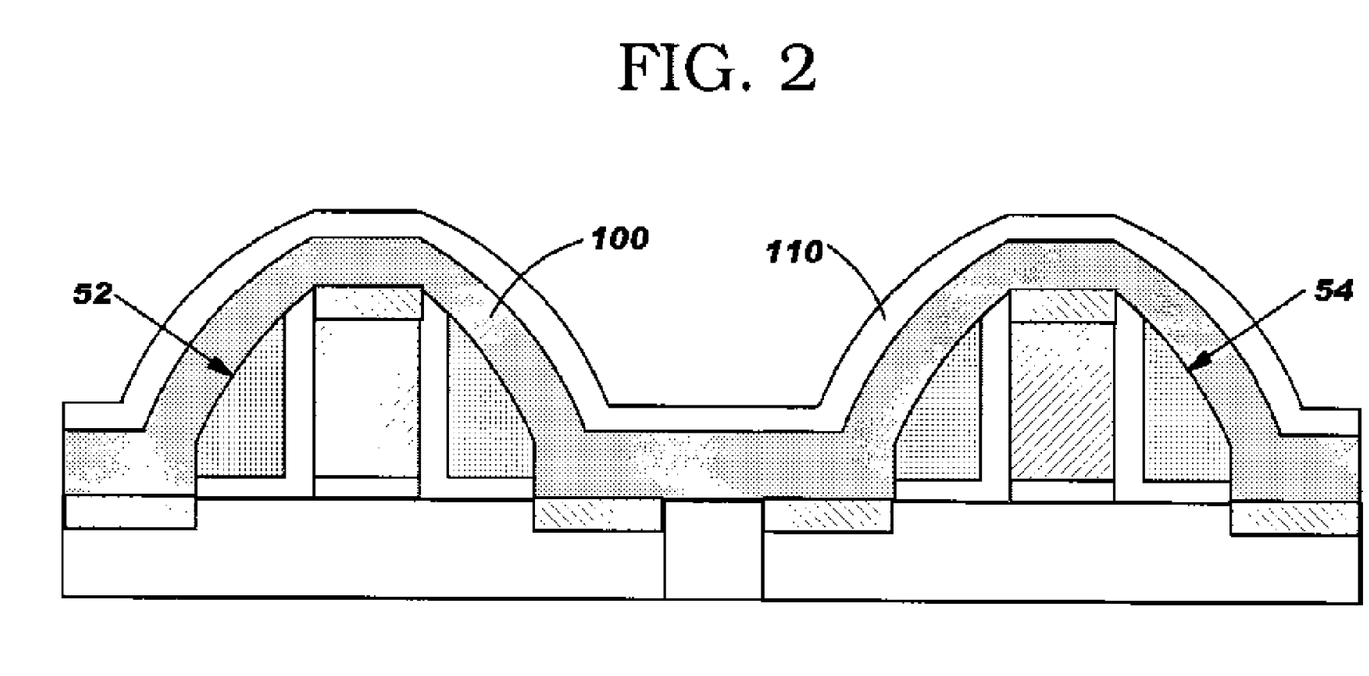

Turning to FIG. 2, a first step of the method includes depositing a first silicon nitride layer 100 (hereinafter "first SiN layer") over PFET 52 and NFET 54. In one embodiment, first SiN layer 100 includes a tensile material, i.e., a material that has intrinsic tensile stress. This embodiment takes advantage of how silicon nitride tends to become tensile when annealed, e.g., even compressive silicon nitride material becomes less compressive or tensile when annealed at elevated temperatures. In this regard, the tensile silicon nitride can withstand more annealing sequences then compressive silicon nitride. Hence, it is advantageous to form a tensile silicon nitride layer first.

As also shown in FIG. 2, a second step includes depositing a hard mask 110 over tensile SiN layer 100. In one embodiment, hard mask 110 includes an oxide such as tetraethyl orthosilicate (TEOS) (Si(OC$_2$H$_5$)$_4$), plasma-enhanced chemical vapor deposited (PECVD) silicon dioxide, carbon doped silicon dioxide, or silicon carbide (SiC).

Figure 3:
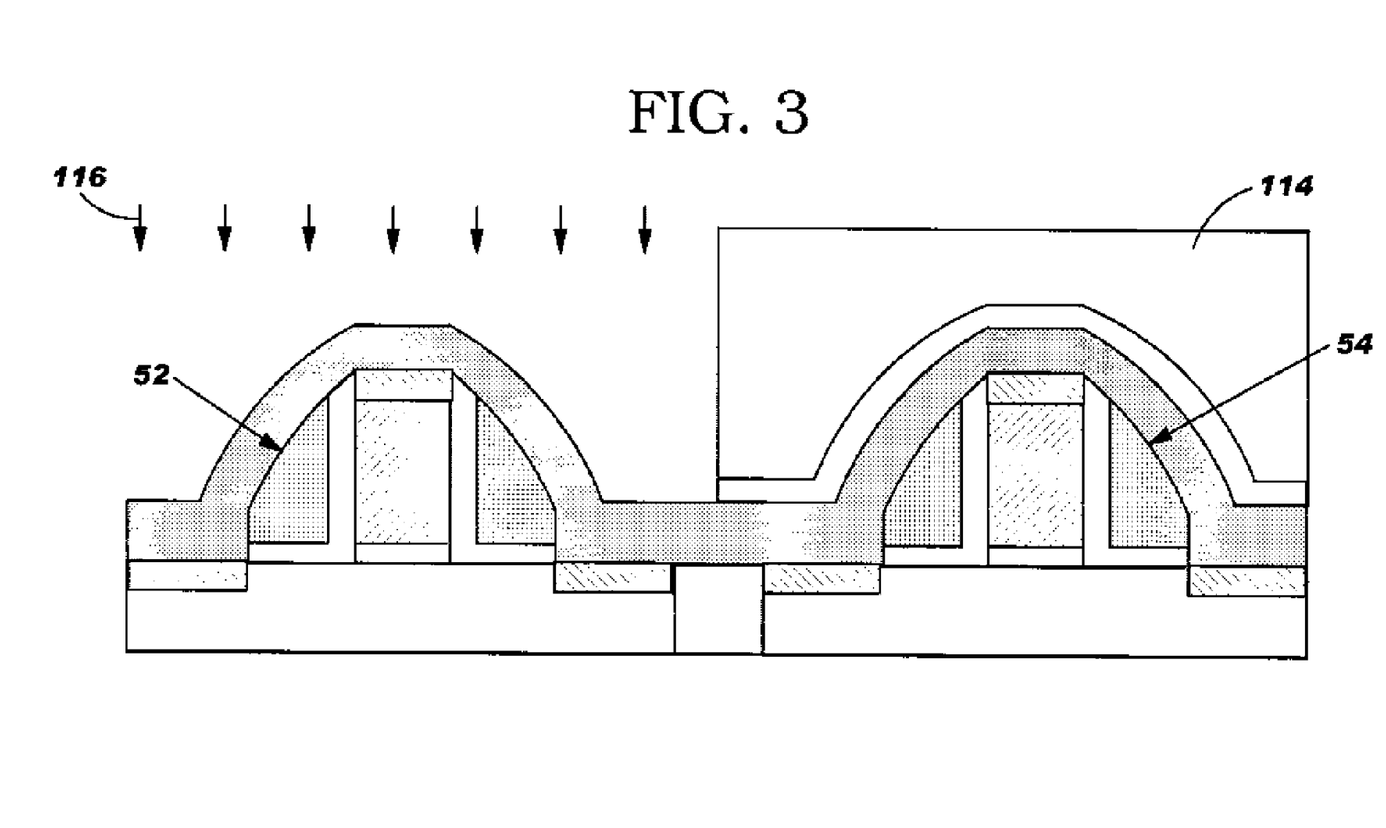

FIGS. 3-4 show the next step, removing hard mask 110 over PFET 52 to first SiN layer 100 using a first photoresist mask 114 (FIG. 3), and then removing first photoresist mask 114 (FIG. 4). Photoresist mask 114 covers NFET 54 and may be any conventional or later developed photoresist material. In one embodiment, hard mask 110 is removed using an oxygen-based reactive ion etch 116 (FIG. 3). However, other etching techniques may also be used. As a result of these steps, hard mask 110 and first SiN layer 100 remain over NFET 54, while only first SiN layer 100 remains over PFET 52. Underlying silicide layer 68, however, is not exposed to photoresist stripping chemicals because it remains covered by first SiN layer 100.

Figure 5:
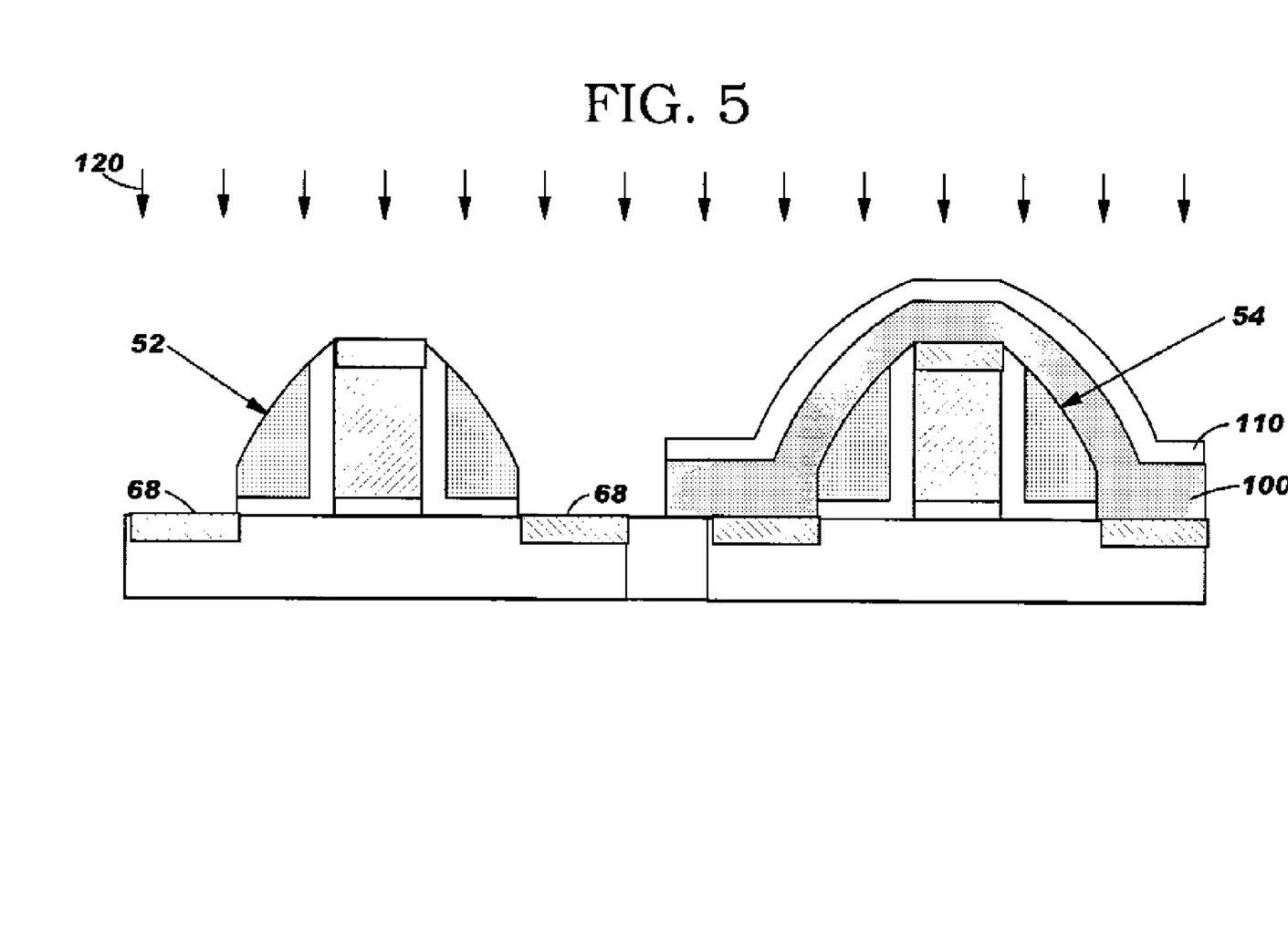

Next, as shown in FIG. 5, first SiN layer 100 is removed over PFET 52 using hard mask 110 over NFET 54 as a pattern. In one embodiment, first SiN layer 100 is removed to underlying silicide layer 68 adjacent PFET 52 by etching 120. Hard mask 110 is at least partially consumed during the etching step. This step allows removal of first SiN layer 100 over PFET 52 and prevents exposure of silicide layer 68 adjacent a transistor to photoresist stripping chemicals during formation of the dual-hybrid liner. An anneal may also be performed at this stage to remove any damage to silicide layer 68 during first SiN layer 100 etch on PFET 52 to reduce silicide resistance. The anneal can also increase tensile stress in first SiN layer 100. The anneal temperature may be from 400° C. to 1000° C. in an inert ambient such as argon (Ar), nitrogen (N$_2$), or hydrogen (H$_2$) or the mixture of these ambients.

Figure 6:
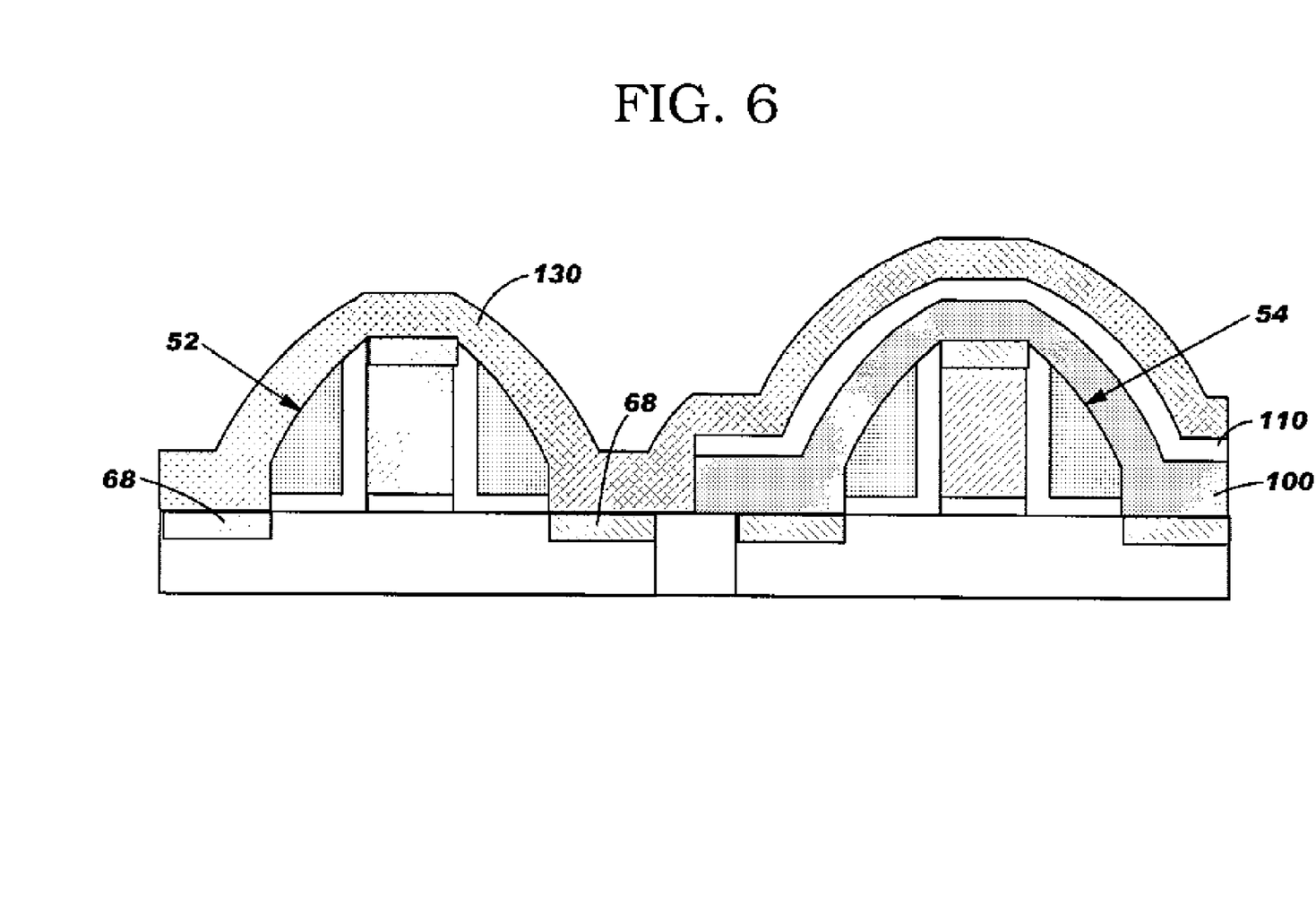

Turning to FIG. 6, a next step includes depositing a second silicon nitride layer 130 (hereinafter "second SiN layer") over PFET 52 and NFET 54. Commensurate with the above-described preferred embodiment in which first SiN layer 100 is tensile, second SiN layer includes a compressive silicon nitride material, i.e., a material that will apply a compressive stress to the underlying structure.

Figure 7:
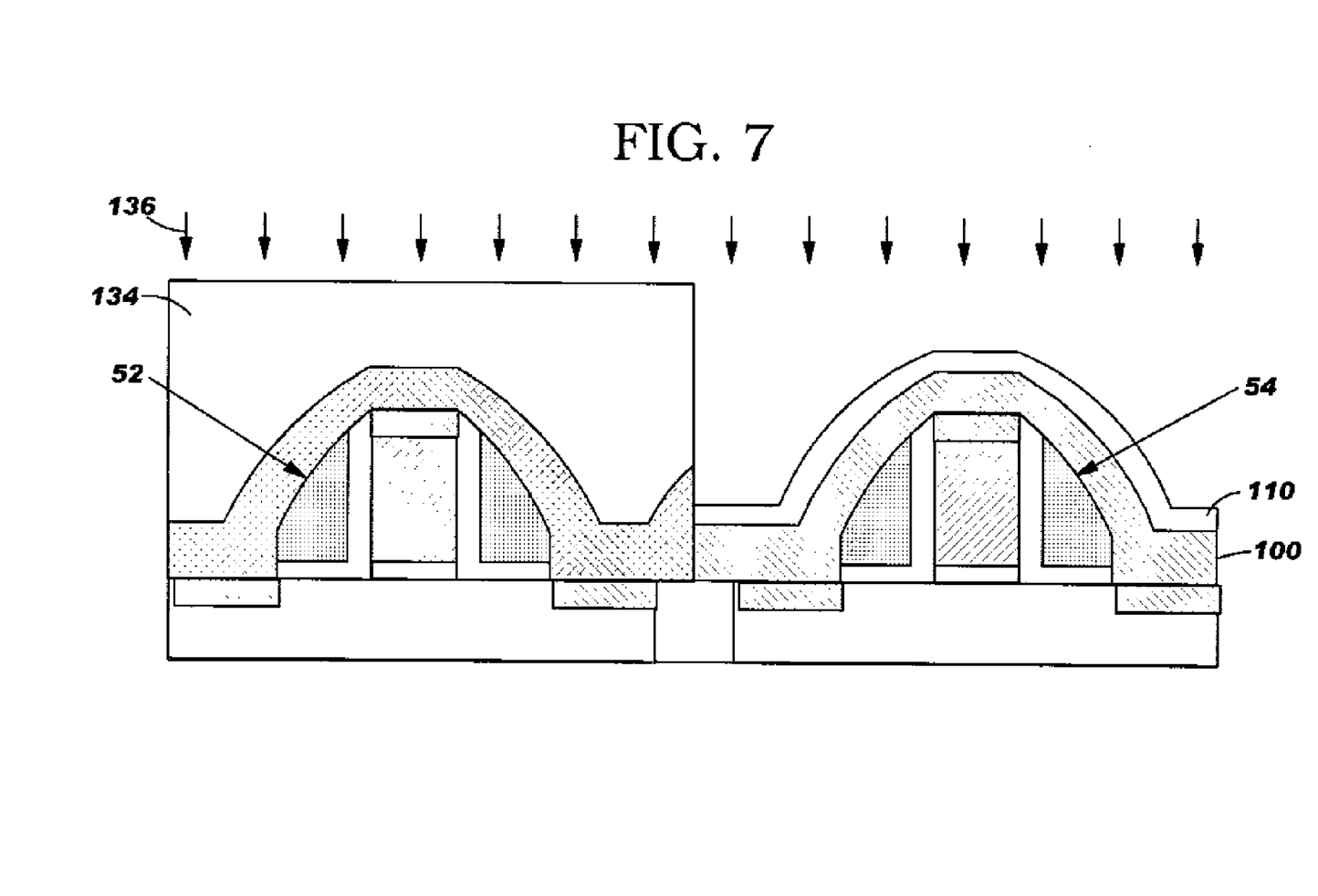
Figure 8:
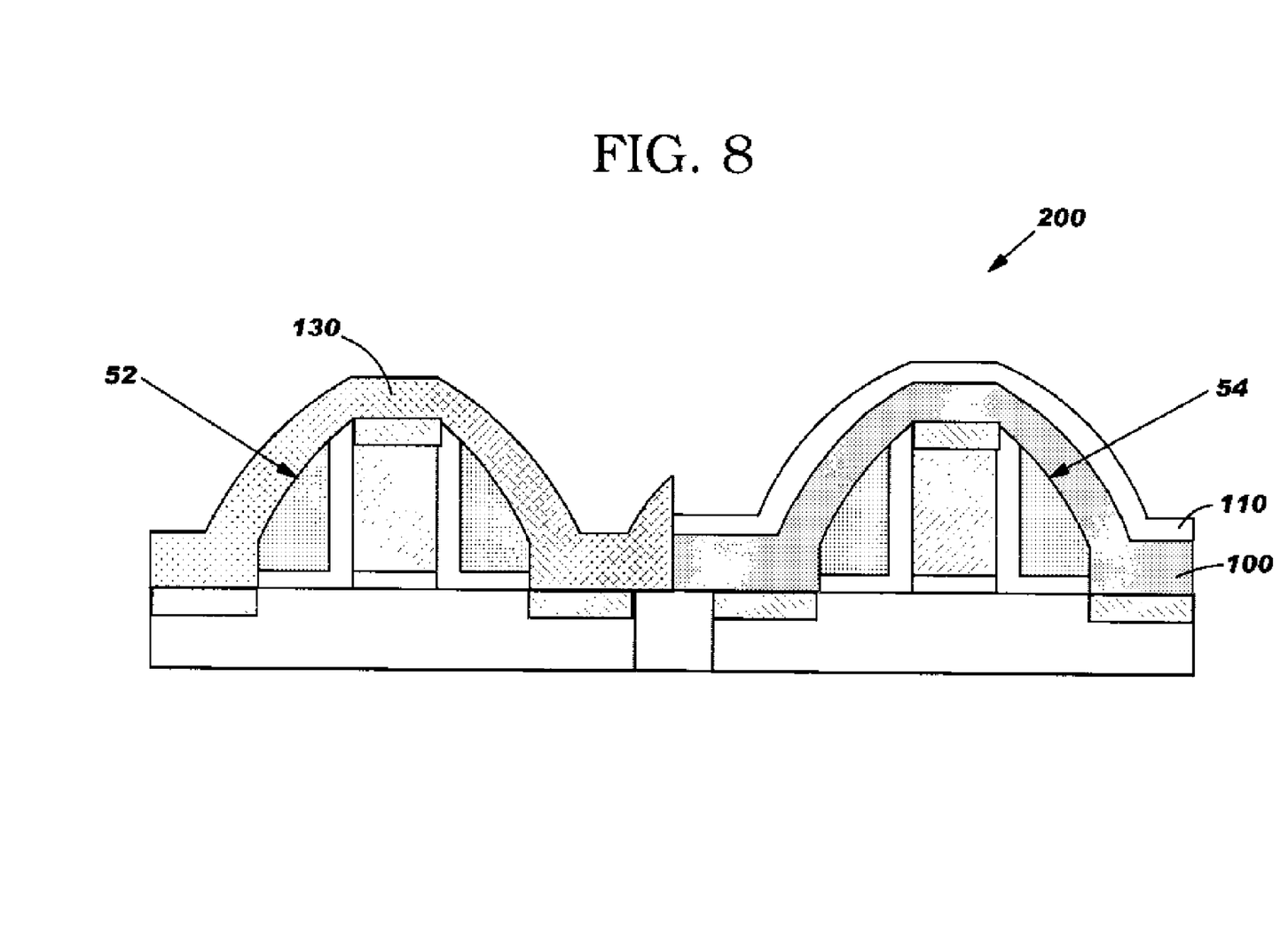

FIGS. 7-8 show the next steps, removing second SiN layer 130 over NFET 54 using a second photoresist mask 134 (FIG. 7), and then removing second photoresist mask 134 (FIG. 8). Photoresist mask 134 covers PFET 52 and may be any conventional or later developed photoresist material. In one embodiment, second SiN layer 130 is removed using any now known or later developed nitride etching technique 136 (FIG. 7). However, other etching techniques may also be used. During this process, hard mask 110 is used as an etch stop to prevent thinning of first SiN layer 100. As a result of these steps, a dual-hybrid liner 200 is formed including hard mask 110 and first SiN layer 100 over NFET 54, and second SiN layer 130 over PFET 52. Dual-hybrid liner 200 will induce stress in the transistor channels of PFET 52 and NFET 54 as known in the art. Underlying silicide layer 68 is not exposed to photoresist stripping chemicals because it remains covered during the entire process. Hard mask 110 also provides a mechanism to control a lateral dimension of each silicon nitride layer 100, 130.

Figure 9:
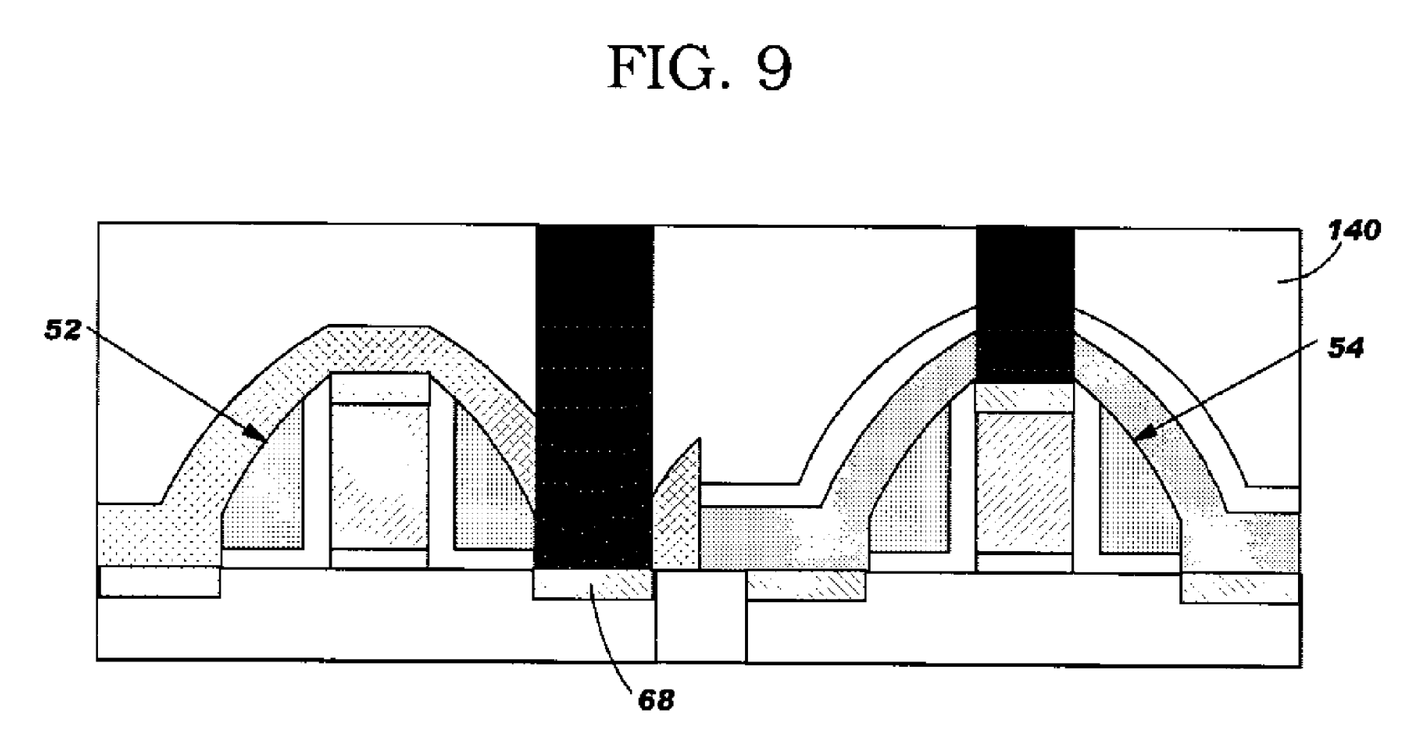

FIG. 9 shows the results of subsequent conventional finishing steps including, inter alia, depositing an interlayer dielectric 140, e.g., high density plasma deposited silicon dioxide SiO$_2$, over PFET 52 and NFET 54, and forming metal contacts 142 to gates, e.g., NFET 54 gate, and/or underlying silicide layer 68.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of fabricating a semiconductor device including a dual-hybrid liner over a PFET and an NFET, the method comprising:
   depositing a tensile silicon nitride layer over the PFET and the NFET;
   depositing a hard mask over the tensile silicon nitride layer, the hard mask including one of tetraethyl orthosilicate (TEOS), plasma-enhanced chemical vapor deposited (PECVD) silicon dioxide, carbon doped silicon dioxide and silicon carbide (SiC);
   removing the hard mask over the PFET to the tensile silicon nitride layer using a first photoresist mask;
   removing the first photoresist mask;
   etching to remove the tensile silicon nitride layer over the PFET to a silicide layer adjacent the PFET using the hard mask as a pattern;
   performing an annealing operation to remove damage to the silicide layer and reduce silicide resistance after etching to remove the tensile silicon nitride layer;
   depositing a compressive silicon nitride layer over the PFET and the NFET;
   removing the compressive silicon nitride layer over the NFET using a second photoresist mask;
   removing the second photoresist mask; and
   depositing an interlayer dielectric over the PFET and the NFET.

2. The method of claim 1, wherein the hard mask is at least partially consumed during the etching.

3. The method of claim 1, wherein the removing of the compressive silicon nitride layer includes using the hard mask as an etch stop.

4. A method of inducing stress in a transistor channel of a PFET and an NFET, the method comprising:
   depositing a first silicon nitride layer over the PFET and the NFET;
   depositing a hard mask over the first silicon nitride layer;
   removing the hard mask over the PFET to the first silicon nitride layer;

etching the first silicon nitride layer over the PFET to a silicide layer adjacent the PFET using the hard mask over the NFET as a pattern;

performing an annealing operation to remove damage to the silicide layer and reduce silicide resistance after etching the first silicon nitride layer; and forming a second silicon nitride layer over the PFET.

5. The method of claim 4, wherein the hard mask includes one of tetraethyl orthosilicate (TEOS), plasma-enhanced chemical vapor deposited (PECVD) silicon dioxide, carbon doped silicon dioxide and silicon carbide (SiC).

6. The method of claim 4, wherein the first silicon nitride layer includes a tensile silicon nitride material, and the second silicon nitride layer includes a compressive silicon nitride material.

7. The method of claim 4, wherein the hard mask is at least partially consumed during the etching.

8. The method of claim 4, wherein the forming of the second silicon nitride layer includes:

depositing a compressive silicon nitride layer over the PFET and the NFET;

removing the compressive silicon nitride layer over the NFET using a photoresist mask; and removing the photoresist mask.

9. The method of claim 8, wherein the removing of the compressive silicon nitride layer includes using the hard mask as an etch stop.

10. The method of claim 4, further comprising depositing an interlayer dielectric over the PFET and the NFET.

11. A method of preventing exposure of a silicide layer adjacent a transistor during formation of a dual-hybrid liner to photoresist stripping chemicals, the method comprising:

depositing a first silicon nitride layer over a first FET and a second FET;

forming a hard mask over the first silicon nitride layer over the first FET;

using the hard mask as a pattern, etching the first silicon nitride layer over the second FET to a silicide layer adjacent the second FET;

performing an annealing operation to remove damage to the silicide layer and reduce silicide resistance after etching the first silicon nitride layer; and forming a second silicon nitride layer over the second FET.

12. The method of claim 11, wherein the hard mask includes one of tetraethyl orthosilicate (TEOS), plasma-enhanced chemical vapor deposited (PECVD) silicon dioxide, carbon doped silicon dioxide and silicon carbide (SiC).

13. The method of claim 11, wherein the first silicon nitride layer includes a tensile silicon nitride material, the first FET includes an NFET, the second silicon nitride layer includes a compressive silicon nitride material, and the second FET includes a PFET.

14. The method of claim 11, wherein the hard mask is at least partially consumed during the using.

15. The method of claim 11, wherein the forming of the second silicon nitride layer includes:

depositing a compressive silicon nitride layer over the second FET;

removing the compressive silicon nitride layer over the first FET using a photoresist mask; and removing the photoresist mask.

16. The method of claim 15, wherein the removing includes etching using the hard mask as an etch stop.

17. The method of claim 11, wherein the using includes:

patterning the hard mask using a photoresist mask;

etching to remove the hard mask over the second FET; and removing the photoresist mask.

18. The method of claim 11, wherein the using stops on an underlying silicide layer of the second FET.

* * * * *